United States Patent [19]

Henderson, Jr. et al.

[11] Patent Number: 4,550,400
[45] Date of Patent: Oct. 29, 1985

[54] REMOTE DIGITAL VOLUME CONTROL SYSTEM

[75] Inventors: James A. Henderson, Jr., Streamwood; Chris B. Tennant, Palatine, both of Ill.

[73] Assignee: Motorola, Inc., Schaumburg, Ill.

[21] Appl. No.: 511,612

[22] Filed: Jul. 7, 1983

[51] Int. Cl.$^4$ .............................................. H04J 3/02
[52] U.S. Cl. ....................................... 370/85; 381/107
[58] Field of Search ................ 370/85, 110.1; 381/77, 381/79, 104, 107, 108

[56]  References Cited

U.S. PATENT DOCUMENTS

| Re. 29,490 | 12/1977 | Shamma | 381/107 |
|---|---|---|---|
| 3,411,153 | 11/1968 | Steele | 381/107 |
| 3,714,579 | 1/1973 | Valdes et al. | 325/319 |
| 3,879,747 | 4/1975 | Sakamoto | 358/1 |
| 3,949,299 | 4/1976 | Song | 325/38 B |
| 4,010,423 | 3/1977 | Collins et al. | 325/391 |
| 4,255,618 | 3/1981 | Danner et al. | 381/77 |
| 4,345,250 | 8/1982 | Jacobsthal | 370/85 |
| 4,359,600 | 11/1982 | Ponto et al. | 179/1 B |
| 4,359,713 | 11/1982 | Tsunoda | 381/107 |
| 4,454,608 | 6/1984 | Maeba | 381/107 |

OTHER PUBLICATIONS

PMI Data Book on Application Note 37 Eight Channel Codec Demonstrator by B. W. Berry, pp. 15–167.

*Primary Examiner*—Douglas W. Olms
*Assistant Examiner*—Frank M. Scutch, III
*Attorney, Agent, or Firm*—Edward M. Roney; Donald B. Southard

[57] ABSTRACT

The remote digital volume control system (10) as used in an audio control apparatus comprising at least one multidigital/audio slot bus (12) which is coupled to base stations through interfaces (21–24). Console interfacing circuits (38) are coupled to the bus (12) and a plurality of remote consoles (30) each with channel control panels (32) coupled to the interfacing circuits (38). The system (10) comprises channel control modules (102) and shared A/D circuitry (150) including two comparators (152, 153) and an up/down counter (154) for generating a four-bit word for each volume control setting of each channel control module (102). The remoted interfacing circuits (38) coupled to said bus include a RAM (180) for storing volume level information for each channel control module (102) and routing information, and a timing control circuit (182) for routing information from the respective digital/audio slots on the bus (12) to audio line driver circuits (71–74) in the consoles (30). The remoted interfacing circuits (38) are controlled by the RAM (180), the timing control circuit (182), and a microprocessor (36) which cause appropriate digital/audio slot information to be converted to an analog signal, muted to the desired level, and routed to a desired audio line driver circuit (71–74) coupled to a speaker (91–94) in a desired console (30).

25 Claims, 3 Drawing Figures

SIMPLIFIED SYSTEM FUNCTIONAL CIRCUIT DIAGRAM

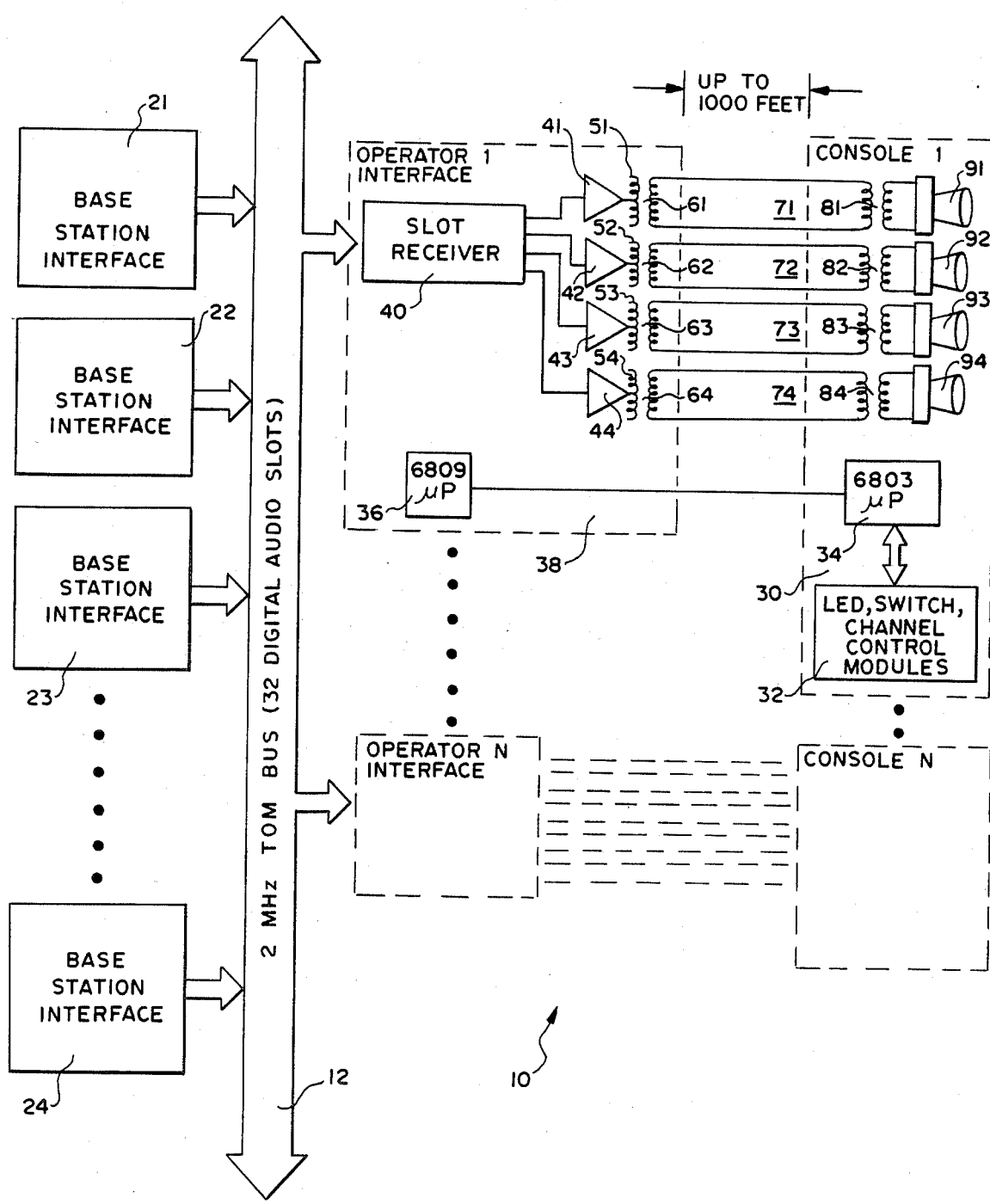
FIG. 1     SIMPLIFIED SYSTEM FUNCTIONAL CIRCUIT DIAGRAM

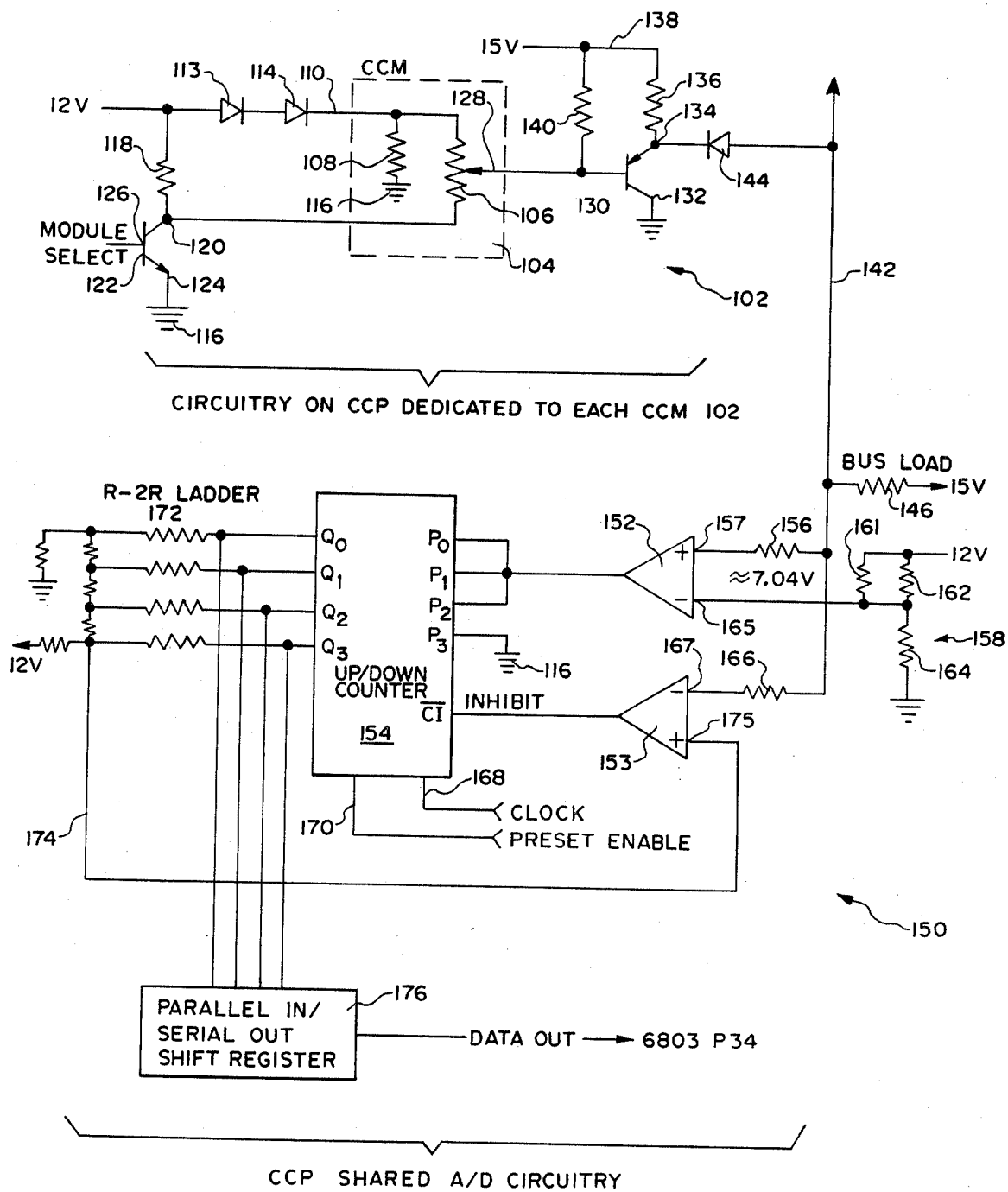
FIG. 2   VOLUME CONTROL CONVERSION CIRCUITRY

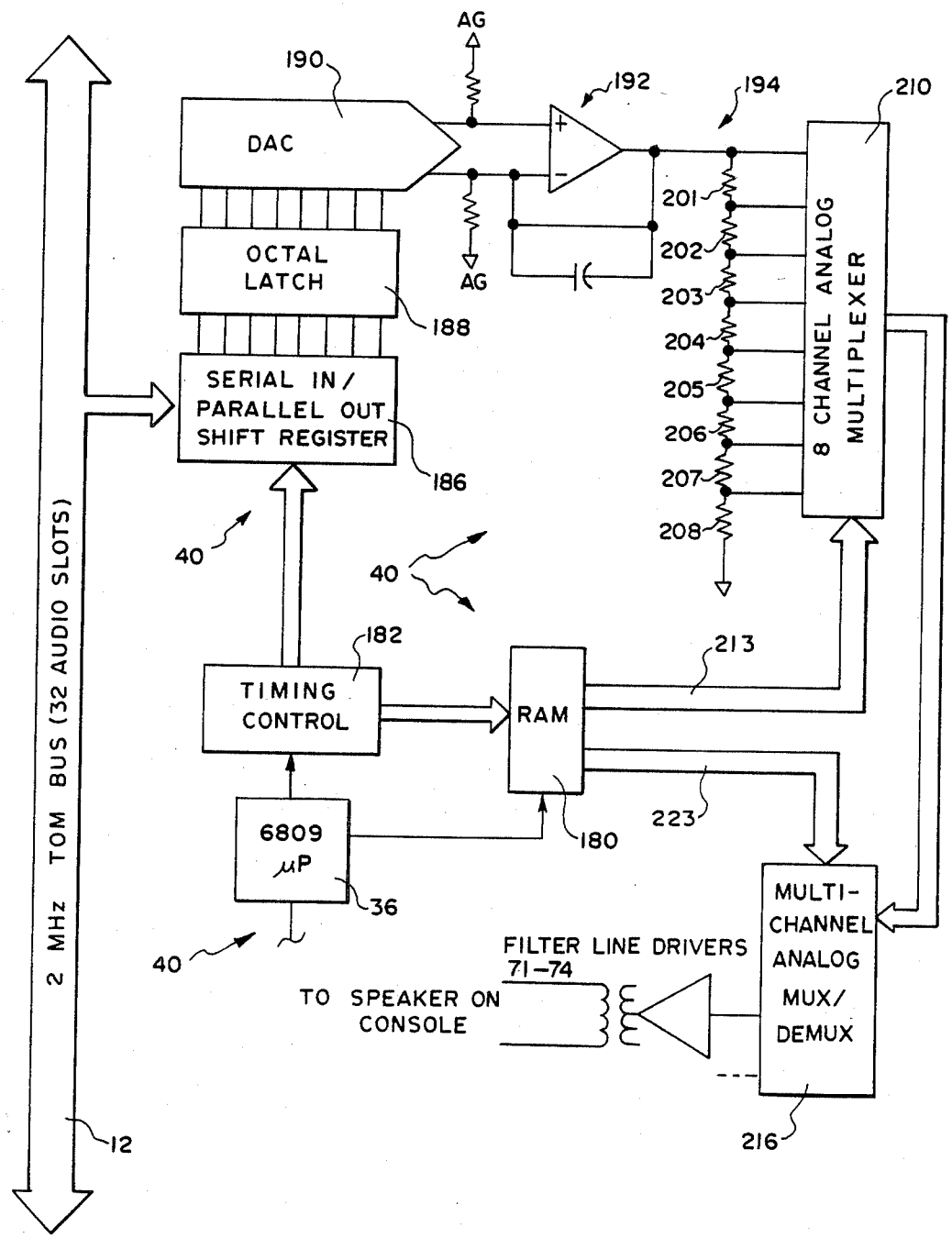
FIG. 3 SLOT RECEIVER SIMPLIFIED FUNCTIONAL CIRCUIT DIAGRAM

REMOTE DIGITAL VOLUME CONTROL SYSTEM

FIELD OF THE INVENTION

The present invention relates to a remote digital volume control system which is used with an audio/radio transmitting and receiving system and wherein audio information that is digitized is supplied from base stations to a 32 digital/audio slot TDM bus and interfacing circuitry coupled to the bus is connected to remote consoles having output channels with speakers and volume control circuits. The digital volume control system is operable to coordinate the voltage level settings at the console with the digital/audio data that is picked up from the slots on the bus and then routed to appropriate channels so that appropriate muting, attenuation, or amplification of the audio conversion of the digital/audio signal is obtained at a desired speed and without the need for expensive circuits to accomplish the routing and volume control.

DESCRIPTION OF THE PRIOR ART

In an audio system where a plurality of base stations are coupled to a bus and interfacing circuitry picks up the digital audio signals placed on the bus and supplies the digital audio signals converted to analog audio signals to remote consoles, an operator of one control center console must have the ability to adjust individually the volume levels of any incoming audio. In a console system, the interfaces to all of the base stations are shared by all operators and can be located up to 1,000 feet away. The audio from the base stations are digitized and multiplexed onto a TDM bus located at equipment remote from the consoles. Each console requires an interface for the TDM bus to undigitize the audio, adjust it to the proper volume/voltage level set by a potentiometer located back on the console, mix it into one of four audio line drivers, and drive these audios to appropriate speakers on the console.

Heretofore, this has been achieved by two systems, one which is slow, and another which is fast and expensive. In the first system, the voltage to be converted is supplied to a comparator which also receives an input from an R-2R ladder. The output from the comparator is supplied to an enable input of a four-bit counter which also receives a clock signal from a microprocessor associated with the audio system. The output of the four-bit counter is supplied to the R-2R ladder which has an output that is incremented upwardly on each clock signal received by the counter. The incremented signal is applied to the comparator until the output from the R-2R ladder exceeds the voltage to be converted as sensed by the comparator. In this system, sixteen clock cycles are required. As will be described in greater detail hereinafter, the system of the present invention only requires a maximum of eight clock cycles.

In the other system, a successive approximation register (SAR) is used in place of a four-bit counter. With this system, the voltage to be converted is converted in four clock cycles which is typically twice as fast as is needed and such circuit, using an SAR, is about three times more expensive than the circuit utilizing a counter described above for the circuit used in the system of the present invention as will be described in greater detail hereinafter.

Also, typically in an interface circuit coupled to a 2 MHz TDM bus, the digital data on the bus is supplied to a shift register which then inputs data sequentially into a latch that supplies a digital-to-analog converter circuit. The output of the digital-to-analog converter circuit is supplied directly to a multiplexor which then has a plurality, e.g., 32, outputs. Since such a system has no central level control circuitry, each output channel from the multiplexer requires its own sample and hold circuit and its own level control circuitry.

As will be described in greater detail hereinafter, the remote digital volume control system of the present invention utilizes an up/down counter that has inputs copuled to the output of a comparator which receives the voltage to be converted from a muting bus and compares such voltage on the muting bus to a reference voltage. The voltage conversion circuitry further includes a control comparator which has an input coupled to the bus and an output coupled to an R-2R ladder which has inputs coupled to four outputs from the up/down counter. The outputs from the up/down counter are also applied to a parallel in/serial out shift register for receiving and then transferring a word having up to 8 bits identifying the voltage level settings of the potentiometer of the channel control on the console.

Further, and as will be described in greater detail hereinafter, each interfacing circuit remote from the console and coupled to the TDM bus includes a digital-to-analog converter, a current-to-voltage converting circuit, an 8 resistor ladder/voltage divider and an 8-channel analog multiplexor by which the output from the digital-to-analog converter can be attenuated by the ladder and an appropriate voltage level as determined by the word can be utilized to determine which voltage level of the ladder is to be outputted from the multiplexor. This is achieved by storing the word in a RAM which is also coupled to the multiplexor and to a multichannel multiplexor/demultiplexor circuit which receives the output from the 8-channel analog multiplexor. The RAM is also coupled to the multiplexor/demultiplexor circuit to supply routing information to same to tell it which audio line driver at the console should be driven by the muted output from the multiplexor/demultiplexor circuit.

SUMMARY OF THE INVENTION

According to the invention there is provided a remote digital volume control system for use in an audio control apparatus comprising at least one multi-digital/audio slot bus, which is coupled to a plurality of base stations and which has a plurality of console interfacing circuits coupled thereto, and a plurality of remote consoles each having several channel control modules therein with the channel control modules in each console being coupled to one of said console interfacing circuits, said system comprising means, at each console, for generating a four-bit word for each volume control setting of each channel control module; means for coupling said generating means to one of said remoted console interface circuits; means, included in each of said remoted console interfacing circuits, for storing volume level information for each channel control module received from one of said consoles and routing information; and means, included in each of said remoted console interfacing circuits, for routing information from the respective digital/audio slots on said bus through audio line driver circuits to speakers in said consoles, said remoted console interfacing circuits being controlled by said level and routing storing means and said routing means which cause appropriate digital- /audio slot information to be converted to an analog signal, muted to the desired level, and routed to a desired audio line driver circuit coupled to a speaker in a desired console.

BRIEF DESCRIPTION OF THE DRAWINGS

FIG. 1 is a simplified functional circuit diagram of the remote digital volume control system of the present invention;

FIG. 2 is a schematic circuit diagram of the volume control conversion circuitry provided in the channel control modules of FIG. 1; and FIG. 3 is a simplified functional circuit diagram of the slot receiver circuit shown in FIG. 1.

DESCRIPTION OF THE PREFERRED EMBODIMENT

Referring now in greater detail to FIG. 1, there is illustrated herein a simplified functional circuit diagram of the remote digital volume control system of the present invention, which system is generally identified by reference numeral 10. As shown, the system 10 includes a 2 MHz TDM bus 12 having 32 digital/audio slots. Coupled to the bus 12 for inputting audio-converted-to-digital information are a plurality of base station interface circuits which can be up to 32 in number and four such interface circuits are shown and identified by reference numerals 21–24.

Each of the base station interface circuits 21–24 is associated with an individual base station. Such base stations (not shown) are typically high-powered radio stations, each of which transmits and receives at a different frequency. These base stations can all be located at one physical location, or be located at several physical locations.

The base station interface circuits 21–24 can be coupled to the base stations by telephone lines.

Coupled to the bus 12 are a plurality of control center consoles, one of which is illustrated in detail and generally identified by reference numeral 30. Such console 30 includes a panel, mounting channel control modules, switches and light-emitting diodes (LED indicators), which is generally identified in the console 30 shown in FIG. 1 by reference numeral 32. The channel control modules are then coupled to a 6803 microprocessor generally identified by reference numeral 34, which is coupled to a 6809 microprocessor generally identified by reference numeral 36, which forms part of a console interface circuit 38 that is coupled to, and receives data from, the bus 12. More specifically, the interface circuit 38 includes a slot receiver circuit 40 which is coupled to the bus 12 and receives the 32 slots of digital/audio information in each slot, and converts such information into an analog signal which is supplied to one of four buffer amplifiers 41–44. Each amplifier 41–44 has an output coupled to the primary winding 51–54 of a transformer 61–64, which forms part of a coupling/noise isolation/impedance matching circuit 71–74. Each of the circuits 71–74 includes an output transformer 81–84 and a speaker 91–94.

The circuits 71–74 can also be considered sample and hold circuits since they sample and hold momentarily the analog conversion of the digital/audio information received by and converted by the slot receiver circuit 40. They are also known as audio line drivers 71–74.

In accordance with one aspect of the teachings of the present invention, the circuit 71 and associated speaker 91 is considered a select channel. The circuit 72 and the associated speaker 92 is considered an unselected channel, and circuit 73 and associated speaker 93 is a first monitor channel, or M-1 channel, and the circuit 74 and the speaker 94 constitutes a second monitor channel, or M-2 channel.

Typically, in use, the volume control setting and the energization of the volume control setting through a switch on the control panel in the console, generally identified by reference numeral 32 in FIG. 1, is coupled through microprocessor 34 and microprocessor 36 to the slot receiver 40, so that the slot receiver knows what amplification or attenuation should be applied to each converted audio signal that is to be supplied to the speakers 91–94 from the 32 possible digital/audio slots on the bus 12.

It is to be noted that the console 30 can be located remotely from the bus 12 and slot receiver circuit 40 of each interface circuit 38 by up to 1,000 feet, as indicated in FIG. 1.

As will be described in greater detail hereinafter, the remote voltage control system 10 of the present invention enables one to obtain (a) the desired routing of audio signals converted from the information in the digital/audio slots picked up from the bus 12 and (b) the desired attenuation or amplification, i.e., dynamic muting, of the audio signal as desired from the remotely located console 30. The system 10 of the present invention is relatively inexpensive, is highly reliable, and has a minimum of parts.

It is contemplated that in the console system 10, interfaces, such as the interfaces 21–24 connected to up to 32 base stations, can be shared by all operators and can be located up to 1,000 feet away. Also, it is contemplated that the audio from up to 96 base stations can be digitized and multiplexed onto one of three 2 MHz TDM buses 12 located at the site of the remote equipment.

Each console 30 requires an interface 38 for each TDM bus 12 to undigitize the audio signal and adjust the same to the proper level set by a potentiometer of a channel control module on the channel control panel 32. Then it is mixed into one of the four circuits 71–74, which can also be characterized as audio line driver circuits for driving the audio speakers 91–94.

Referring now to FIG. 2 in greater detail, there is illustrated therein volume control conversion circuitry/interface module identified by the reference numeral 102. It will be understood that each console 30 contains at least one interface module 102, which is dedicated for each base station that the console 30 is intended to control. Such interface module 102 is referred to as a channel control module 102 or simply by the acronym CCM.

The core of each CCM 102 is a potentiometer circuit 104 including a potentiometer 106 and a voltage dropping resistor 108. The resistor 108 is coupled between a voltage line 110 that is energized from a 12-volt source through diodes 113 and 114 and ground 116. The 12-voltage source is also connected through a resistor 118 to the collector 120 of a transistor 122, having its emitter 124 connected to ground 116. The potentiometer 106 is connected across or between the voltage line 110 and the collector 120 of the transistor 122. The base 126 of the transistor 122 is coupled to a module select line from the microprocessor 34.

A wiper arm 128 of the potentiometer 106 is coupled to the base of a transistor 130 that has its collector 132 connected to ground 116, and its emitter connected through a resistor 136 to a 15-volt potential line 138.

Another resistor 140 is connected between the line 138 and the base of the transistor 130.

Also a bus 42 is connected through a diode 144 to the emitter 134. The bus 142 is also coupled through a loading resistor 146 to the 15-volt supply.

Each interface module or CCM 102 contains electronic switches such as the transistor 122 and the transistor 130, and light-emitting diodes (not shown) for controlling the base station and for keeping status. Also, each CCM 102 includes one or two volume control or potentiometer circuits 104 for setting the levels of the incoming audio as converted and amplified by the slot receiver circuit 40. Eight of the CCM's 102 can be housed in one channel control panel or CCP 32.

The microprocessor 34 scans all the switches 122, which can be referred to as module select switches 122, and controls all the LED's. It also sends data to, and receives data from, the microprocessor 36 in the remoted electronics of the operator interface 38.

The channel control panel 30 shares, with its CCM's 102, analog-to-digital circuitry 150 for converting the volume control settings of the potentiometer 106 into four-bit digital words during each 8-clock cycle from a clock output of the microprocessor 34.

Since the microprocessor 34 must scan 720 switches every 25 milliseconds, the settings of the volume controls or potentiometer circuits 104, on each CCM 102, must be converted at the same time that the switches 122 are energized. In the system 10 of the present invention, common clock signals are used to perform both functions to minimize parts count and reduce cabling. Eight steps of audio level were found necessary to obtain good audio resolutions. As a result, the potentiometer 106 settings has to be resolved into sixteen steps. For this purpose, the circuitry 150 provides four-bit words so that the software of the microprocessor 34 can process the four-bit word and convert it into a three-bit word, whereby the levels in the speakers 91–94 do not bounce back and forth between two adjacent steps.

When the volume control circuit 104 for a particular CCM 102 is not selected, the transistor 122 is non-conducting and the output of the CCM 102 is approximately 10.6 volts.

At the emitter 134 of the transistor 130, the voltage is 11.3 volts and the bus 142 will be at 12 volts through the diode 144, unless another CCM's volume control circuit 104 is pulling it lower. In that case, the diode 144 isolates transistor 130 from the bus 142.

When the CCM 102 shown in FIG. 2 is selected by the microprocessor 34, transistor 122 is turned on and the potential at collector 120 is pulled low to the ground potential of ground 116. The voltage at the base of transistor 130 is set by the voltage divider action of the potentiometer 106 at between 0 and 10.6 volts. The bus 142 is 1.4 volts higher, so it is between 1.4 volts and 12 volts.

As will be described below, this voltage between 1.4 volts and 12 volts is converted into a four-bit word by comparators 152, 153, and an up/down counter 154 in A to D circuitry 150 as well as the resistors associated therewith. In this respect, it will be noted that the comparator 152 has its positive input 157 supplied from the bus 142 through a resistor 156. This voltage is compared with a preset voltage of approximately 7.04 volts from a voltage divider 158 which is supplied from a 12-volt source, and which has one leg comprised of two parallel connected resistors 161 and 162 and another leg having one resistor 164. The 7.04 volts between the two legs is supplied to the negative input 165 of the comparator 152. It will be appreciated that when the voltage supplied to the input 157 from the bus 142 is above the preset voltage on the negative input 165 of the comparator 152, a logic 1 output is supplied to the input ports $P_0$, $P_1$, $P_2$ of the up/down counter of 154. Similarly, when the voltage supplied to the input 157 is below the preset voltage supplied to the negative input 165 of the comparator 152, a logic 0 is supplied to the input ports $P_0$, $P_1$, $P_2$ as shown. It will be appreciated that the greater the current drain through diode 144 and through transistor 130, the lower the voltage that is supplied to the input 157 of the comparator 152 and through a buffer resistor 166 which supplies voltage to a negative input 167 of the comparator 153.

After the counter 154 is enabled, clock signals are inputted to clock input 168 of counter 154 sequentially.

However, before this development of up to a four-bit word is carried out, the microprocessor 34 imposes a time delay between the time a signal is supplied to the base 126 of the transistor 122 to turn it on to allow for stabilization of the voltage levels in the circuitry of CCM 102. After the time delay, a preset enable signal is supplied from the microprocessor 34 to an enable port 170 of the up/down counter 154. As a result, an output from the comparator 152 is generated only by a stabilized voltage at the emitter 134 that is compared with the preset voltage of 7.04 volts from the voltage divider 158 and such output level, 1 or 0, is supplied to input port $P_0$, $P_1$ and $P_2$ and clocked to output ports $Q_0$, $Q_1$ and $Q_2$ when the enable signal is received by counter 154.

The output levels of logic 1 or logic 0 at the output ports $Q_0$–$Q_3$ ($Q_3$ being initially at 0) is supplied to an R-2R ladder 172. An output line 174 from the ladder 172 is coupled back to a positive input 175 of the comparator 153. The output from the up/down counter 154 is also supplied to a parallel in/serial out shift register 176, and the data from the shift register 176 is supplied to the microprocessor 34. For a voltage on muting bus 142 below 7.04 volts, an initial output of logic 0 at outputs $Q_0$–$Q_3$ results in a voltage of about 2.0 volts on line 174 from the R-2R ladder 172 and this voltage is indexed or incremented upwardly on every succeeding clock signal by approximately 0.65 volts until the voltage at input 175 of comparator 153 exceeds the voltage at input 167. At that point in time, the desired four-bit digital word related to the potentiometer 106 setting is generated at $Q_0$–$Q_3$ and input to and outputted from shift register 176. The word generation is then stopped by the output of the comparator 153 going from logic 0 to logic 1 and being supplied to inhibit port $\overline{CI}$ which stops the clock signal from incrementing the voltage levels at output ports $Q_0$–$Q_3$.

If the counter 154 was a simple four-bit counter, then the comparators 152 and 153 and associated resistors 156 and 166 would function together as a standard four-bit discreet A/D convertor which would convert in 16-clock cycles. However, the up/down counter is a presetable counter and along with the comparator 152 is connected to a reference voltage equivalent to the output of the R-2R ladder 172 at count eight. If the voltage on the bus 142 is less than the reference voltage, the preset inputs at $P_0$, $P_1$ and $P_2$ are programmed for logic 0. The circuit 150 in converting the analog signal to a digital signal will count from zero to eight.

However, if the voltage generated from the potentiometer circuit 104 is greater than the reference voltage, the preset inputs $P_0$, $P_1$, $P_2$ are programmed for logic 1. The circuit 150 will then count from 7 to 15.

The reference voltage is not critical as long as it is greater than the output of the R-2R ladder 172 at count 7 and less than the output of the ladder 172 at count 9. This is because the reference voltage does not determine any bits directly but only the voltage range the circuitry 150 will convert over.

The clock input signal to the clock input 168 will cause the output of comparator 153 to count up until the output of ladder 172 applied to input 175 of the comparator 153 becomes higher than the voltage on the bus 142. At that time, the up/down counter 154 will stop counting.

Because the voltage from the voltage control or potentiometer circuit 104 is continuous, the output from this potentiometer circuit 104 can be set anywhere, including the switching point between two steps. In the presence of noise, the output of the A to D circuitry 150 could possibly ping pong between these levels which would have an annoying effect on the audio of the speaker. This is prevented by the microprocessor 34 which ignores a one-count change in the mute level from the last time it was read. When a two-count or a greater change has occurred, the microprocessor 34 saves the new potentiometer setting converted into digital form and sends the upper three bits of the new word to the microprocessor 36 at the remoted electronics of the interface circuit 38 for processing.

In this way, the voltage of the potentiometer circuit 104 as set by the position by the wiper arm 128 is converted to an four-bit data word by the A/D circuit 150 and supplied to the microprocessor 34. If there is a change in this word from the word stored in the memory or RAM of the microprocessor 34, then the RAM is updated and this updated value is supplied to the microprocessor 36 which updates the value for this channel control module 102 in a memory or a RAM 180 (FIG. 3) associated with the microprocessor 36. In this way, the volume control setting of the potentiometer 106 in the potentiometer circuit 104 for a particular channel speaker 91-94 is utilized for dynamically muting the converted analog signal from a digital/audio information signal from the bus 12. The microprocessor 36 with a timing control circuit 182 for controlling routing of the slot signal to the appropriate channel circuit 71-74 will correlate the volume control signal stored in the RAM 180 with that digital visual/audio signal for the appropriate slot related to the appropriate base station to effect the desired volume control as now will be described in greater detail in connection with the description of FIG. 3.

As shown, the microprocessor 36 controls the timing control circuit 182 and the output from the RAM 180. The timing control circuit 182 is coupled to a serial in/parallel out shift register 186 which receives data from the 32 digital/audio slots on the bus 12, and according to the directions from the timing control circuit 182, routes the particular slot digital/audio information signal, after its conversion to an analog signal, to the appropriate signal channel circuit or audio line driver circuit 71-74. This is effected by first taking the signal digital information received in the shift register 186 and outputting it to an OCTAL LATCH 188 from where it is outputted to a digital-to-analog converter circuit (DAC) 190. The digital-to-analog circuit 190 outputs the analog signal to a current-to-voltage converting circuit 192 and the output from this circuit is supplied to a voltage ladder or divider 194. The ladder 194 has eight resistors 201-208 for dividing up the voltage output from the current-to-voltage converter circuit 192 into eight levels. These eight analog levels or values are supplied to an eight channel analog multiplexer 210, which receives a signal over multiple lines 213 from the RAM 180 that tell the multiplexor 210 which value is to be utilized for amplifying, attenuating or muting the voltage signal received from the digital-to-analog circuit 190 as converted by the current to voltage circuit 192. This signal is supplied from the multiplexor 210 to the inputs of a multichannel analog multiplexor/demultiplexor circuit 216.

In this way, the remoted electronics of the slot receiver circuit 40, and more specifically the microprocessor 36, processes the volume level data received from the shift register 176 and sends it to the slot receiver circuit 40 to effect the actual level or change in volume control while timing control circuit 182 controls the routing of the digital/audio slot information that is attenuated by analog multiplexer 210.

The slot receiver circuit 40 takes all 32 digital/audio slot signals on the TDM bus 12 and converts them back to analog values. The slot receiver circuit 40 then adjusts the level of such signal independently with the ladder 194 and multiplexer 210, and the microprocessor 36 and timing control circuit 182 routes the signal outputted from the multiplexor 210 to the appropriate line driver circuit 71-74 as determined by the information received from the RAM 180 over lines 223.

The RAM 180 is typically a 32 byte RAM and contains data for selecting the attenuating level as well as for the routing destination for each interval or sequence of digital/audio slot information data.

Whenever level or destination changes are necessary, the microprocessor 36 updates the appropriate byte in the RAM 180. Otherwise, the RAM 180 controls slot receiver circuit 40, thereby off-loading the microprocessor 36 from this task, so it can perform more important tasks. The audio line driver circuit 71-74 includes the audio filter/line drivers defined by amplifiers 41-44 and transformers 61-64. These audio filter/line drivers or buffers perform several functions. First their leakage properties allow the voltage level of many slots on the bus 12 to be sampled and averaged together which, in effect, mixes the signals together. Because each slot on the bus 12 is sampled for only 1/32 of the total sampling time its level is attenuated by 30 dB altogether. The buffer amplifiers 41-44 each have a large voltage gain to compensate for this 30 dB loss. They also have current gain to drive a balance twisted pair line of each of the circuits 71-74 connected to a speaker 91-94 on a console 30 up to 1000 feet away.

From the foregoing description, it will be apparent that the circuitry in each console 30, as illustrated in greater detail in FIG. 2, together with the remoted electronics within the slot receiver circuits 40, as shown in greater detail in FIG. 3, provide a low cost, highly reliable system 10 for controlling the level of the digital/audio signals received off of a TDM bus 12 with settings of many individual volume control potentiometer 106 remote from the actual audio source.

Also, it will be apparent that the system 10 can be used to control the individual slot levels or digital audio information data in a slot received off of a CCITT or D3/D4 digital format type TDM buses 12.

Thus, with the system 10 of the present invention, a presettable counter 154 together with comparators 152,153 and a resistor divider network 158 (voltage reference) are incorporated into a standard analog-to-digital circuit 150 to double the speed at which the circuit 150 converts.

Also, at the remoted electronics within the slot receiver circuit 40, a resistor ladder 194, an eight channel multiplexor 210 and a multiplexor/demultiplexor 216 together with a RAM 180 and a timing control circuit 182 controlled by a microprocessor 36 are coupled to a digital-to-analog converting circuit 190 to achieve individual level control and mixing of audio information signals.

From the foregoing description, it will be apparent that the remote digital volume control circuit of the present invention has a number of advantages some of which have been described above and others of which are inherent in the invention. Accordingly, the scope of the invention is only to be limited as necessitated by the accompanying claims.

We claim:

1. A remote digital volume control system for use in an audio control apparatus comprising at least one TDM digital audio bus, which is coupled to a plurality of audio sources and which has a plurality of console interfacing circuits coupled thereto, and a plurality of remote consoles each having several channel control modules therein with the channel control modules in each remote console being coupled to one of said console interfacing circuits, said system comprising:
   means, at each console, for generating a four-bit word for each volume control setting of each channel control module;
   means for coupling said generating means to one of said console interface circuits;
   means, included in each of said console interfacing circuits, for storing volume level information for each channel control module received from one of said remote consoles and routing information; and
   means, included in each of said console interfacing circuits, for routing information from the respective digital/audio slots on said bus through audio line driver circuits to speakers in said console; said console intefacing circuits being controlled by said level and routing storing means and said routing means which cause appropriate digital/audio slot information to be converted to an analog signal, muted to the desired level, and routed to a desired audio line driver circuit coupled to a speaker in a desired console.

2. The system of claim 1 wherein said channel control module comprises a module select switch and a potentiometer which is series connected with said module select switch.

3. The system of claim 2 wherein said module select switch is a transistor.

4. The system of claim 3 wherein said word generating means includes a microprocessor coupled to said module select transistor switch.

5. The system of claim 2 wherein said word generating means includes a muting bus supplied from a voltage source and a voltage dropping circuit coupled between said muting bus and said potentiometer.

6. The system of claim 5 wherein said voltage dropping circuit includes a transistor, the base of which is coupled to a wiper arm of said potentiometer, the emitter of which is coupled to system ground, and the collector of which is coupled through an isolating diode to said muting bus.

7. The system of claim 6 wherein said word generating means includes counting circuit means coupled to said bus for converting the voltage pull down of said muting bus by said voltage dropping circuit as determined by the setting of said potentiometer to a word comprising at least four bits and being indicative of the voltage setting of said potentiometer.

8. The system of claim 6 wherein said counting circuit means comprises an up/down counter, a first comparator having an input coupled to said bus, another input coupled to a reference voltage, and an output coupled to three input ports of said up/down counter, a further input port of said counter being coupled to system ground, a second comparator having an output coupled to an inhibit port of said up/down counter and one input coupled to said muting bus, an R-2R ladder having inputs coupled to four outputs of said up/down counter and an output coupled to the other input of said second comparator, a parallel in/serial out shift register coupled to the four counter outputs and a microprocessor coupled to said module select switch, to the output of said shift registers, to a clock input of said counter to an enable port of said counter and to said console interfacing circuit.

9. The system of claim 1 wherein said volume level and routing storing means includes a microprocessor.

10. The system of claim 1 wherein said volume level and routing storage means includes a RAM and said routing means includes a timing control circuit coupled to said RAM.

11. The system of claim 1 wherein each interfacing circuit comprises a slot receiving circuit including said volume level and routing storing means, a digital-to-analog slot signal converting circuit means, a resistor ladder/voltage driver, a multi-channel analog multiplexor and analog signal routing means having outputs coupled to the audio line driver circuits in the associated console, said converting circuit means having an input coupled to said bus and another input coupled to said storing means, and an output coupled to said resistor ladder, said analog multiplexor having inputs coupled to said resistor ladder and an output coupled to said routing means, and said storing means being coupled to said multiplexor and to said analog signal routing means.

12. The system of claim 11 wherein said storing means also defines said routing means when there is no change in volume levels.

13. The system of claim 12 wherein said routing means comprises a microprocessor having an input coupled to said word generating means and outputs coupled to said converting circuit means and to said storing means.

14. The system of claim 11 wherein said resistor ladder comprises eight resistors and said multiplexor is an eight-channel analog multiplexor.

15. The system of claim 11 wherein said converting circuit means includes a current-to-voltage converting circuit coupled to said resistor ladder.

16. The system of claim 15 wherein said digital-to-analog converter circuit means includes a serial in/parallel out shift register coupled to said bus, a D/A converter having an output coupled to said current-to-voltage converting circuit and a latch coupled to and between said shift register and said D/A converter.

17. The system of claim 11 wherein said storing means is a RAM and said routing means includes a timing control circuit coupled to said digital-to-analog converting circuit means.

18. The system of claim 17 wherein said routing means further includes a microprocessor coupled between said RAM and said timing control circuit.

19. The system of claim 11 wherein said analog signal routing means comprises a multi-channel analog multiplexor/demultiplexor.

20. A method for remotely controlling volume in an audio control apparatus comprising at least one multi-digital/audio slot bus, which is coupled to a plurality of base stations and which has a plurality of console interfacing circuits coupled thereto, and a plurality of remote consoles each having several channel control modules therein with the channel control modules in each console being coupled to one of said console interfacing circuits, said method comprising the steps of:
   generating, at each console, a four-bit word for each volume control setting of each channel control module;
   supplying said generating word to one of said remoted console interfacing circuits;
   storing, in each of said remoted console interfacing circuits, and routing information, volume level information for each channel control module received from one of said consoles;
   routing from each of said remoted console interfacing circuits, desired information from a digital/audio slot on said bus, muted to the desired level, through a desired audio line driver circuit to a desired speaker in a desired console.

21. A method for effecting volume control in a multi-channel, audio/digital, digital/audio apparatus including a multi-digital/audio bus comprising the steps of:
   selecting data from a data slot on the bus;
   correlating the selected data with a selected audio channel;
   converting the digital data to a current signal;
   converting the current signal to a voltage signal;
   supplying the voltage signal to a resistor/voltage divider ladder coupled to a multi-channel analog multiplexor; and
   routing a selected voltage level from said multiplexor related to a voltage setting in a control channel module in a remote console through an audio driver to a speaker in the console.

22. A method for effecting volume control in an audio/digital, digital/audio apparatus including at least one console having multiple channels with each channel having a volume control setting, comprising the steps of:
   converting the volume control setting to a voltage;
   using that voltage to create a current drain from a muting bus at a selected point in time;
   generating a four bit word related to the amount of voltage pull down on the muting bus caused by the current drain above or below a given voltage level;
   routing the word to word storing; and
   retrieving the voltage level information in said word in relation to the pick up digital-to-analog converting the subsequent muting of a selected slot of data from a digital/audio bus which digital-to-analog converted data is to be muted according to the retrieved voltage level information and routed through a selected audio driver to a selected speaker in a selected console.

23. Volume control circuitry for use in a multi-channel, audio/digital, digital/audio apparatus comprising:
   means for selecting data from a data slot on the bus;
   means for correlating the selected data with a selected audio channel;
   means for converting the digital to a current signal;
   means for converting the current signal to a voltage signal;
   a resistor/voltage divider ladder coupled to the output of said current-to-voltage converting means;
   a multi-channel analog multiplexor coupled to said ladder; and
   means for routing a selected voltage from said multiplexor related to a voltage setting in a control channel module in a remote console, through an audio driver to a speaker in the console.

24. Volume control circuitry for use in an audio/digital, digital/audio apparatus including at least one console having multiple channels with each channel having a volume control setting comprising:
   means for converting the volume control setting to a voltage;
   a muting bus;
   means for causing that voltage to create a current drain from said muting bus at a selected point in time;
   means for generating a four bit word related to the amount of voltage pull down on the muting bus caused by the current drain above or below a given voltage level;
   means for routing the word to word storage means; and
   means for retrieving the voltage level information in said word in relation to the pick up, digital-to-analog conversion and subsequent muting of a selected slot of data from a digital/audio bus, which digital-to-analog converted data is to be muted according to the retrieved voltage level information and routed through a selected audio driver to a selected speaker in a selected console.

25. The volume control circuitry of claim 24 wherein said word generating means comprise:
   an up/down counter; an R-2R resistor ladder coupled to several outputs of said counter;
   a first high/low selection converter having one input coupled to said muting bus, another input coupled to a reference voltage, and an output coupled to several inputs of said counter;
   a clock pulse inhibiting comparator having one input coupled to said muting bus, another input coupled to an output of said ladder; and
   a microprocessor coupled to a clock input of said counter, to an enable port of said counter, to said counter outputs and to a remote word storing and signal routing means.

* * * * *